(12) United States Patent
Son et al.

(10) Patent No.: US 9,885,950 B2
(45) Date of Patent: Feb. 6, 2018

(54) PHASE SHIFT MASK, METHOD FOR MANUFACTURING THE SAME, AND METHOD FOR FORMING MICRO PATTERN

(71) Applicant: Samsung Display Co., Ltd., Yongin (KR)

(72) Inventors: Yong Son, Suwon-si (KR); Min Kang, Seoul (KR); Bong Yeon Kim, Seoul (KR); Hyun Joo Lee, Seoul (KR); Jin Ho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

(21) Appl. No.: 14/691,530

(22) Filed: Apr. 20, 2015

(65) Prior Publication Data

US 2016/0170294 A1 Jun. 16, 2016

(30) Foreign Application Priority Data

Dec. 10, 2014 (KR) .................... 10-2014-0177484

(51) Int. Cl.
*G03F 1/26* (2012.01)
*G03F 1/34* (2012.01)
*G03F 1/54* (2012.01)
*G03F 1/32* (2012.01)

(52) U.S. Cl.
CPC . *G03F 1/54* (2013.01); *G03F 1/32* (2013.01)

(58) Field of Classification Search
CPC ................ G03F 1/24; G03F 1/26; G03F 1/34
USPC ............................................................ 430/5
See application file for complete search history.

(56) References Cited

U.S. PATENT DOCUMENTS

| 5,641,592 | A | * | 6/1997 | Kim | G03F 1/32 430/322 |
| 5,871,869 | A | * | 2/1999 | Park | G03F 1/30 430/5 |
| 5,935,733 | A | * | 8/1999 | Scott | B82Y 10/00 430/5 |
| 2005/0112476 | A1 | | 5/2005 | Bellman et al. | |
| 2013/0288165 | A1 | * | 10/2013 | Nam | G03F 1/26 430/5 |

FOREIGN PATENT DOCUMENTS

| JP | 07-333825 | 12/1995 |
| KR | 10-0161856 | 8/1998 |
| KR | 10-0295385 | 9/2001 |
| KR | 10-2007-0044985 | 5/2007 |

* cited by examiner

*Primary Examiner* — Stephen Rosasco
(74) *Attorney, Agent, or Firm* — H.C. Park & Associates, PLC

(57) ABSTRACT

A phase shift mask enables much smaller scale of electronic circuit pattern. A phase shift mask comprises a transparent substrate, a phase shift pattern arranged on the transparent substrate to change a phase of light that penetrates the transparent substrate, and a metal coating layer arranged on at least a part of a surface of the phase shift pattern.

14 Claims, 6 Drawing Sheets

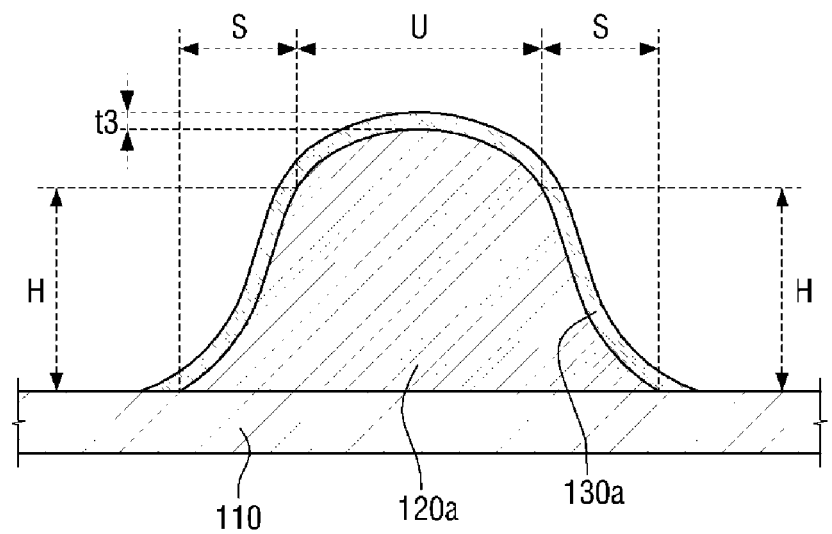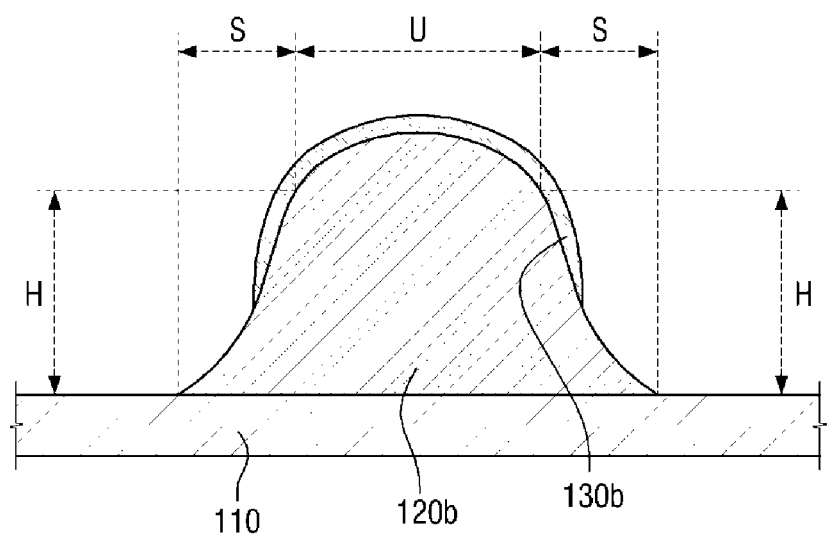

PHASE SHIFT MASK, METHOD FOR MANUFACTURING THE SAME, AND METHOD FOR FORMING MICRO PATTERN

CROSS-REFERENCE TO RELATED APPLICATION

This application claims priority from and the benefit of Korean Patent Application No. 10-2014-0177484, filed on Dec. 10, 2014, which is hereby incorporated by reference for all purposes as if fully set forth herein.

BACKGROUND

Field

Exemplary embodiment relates to a phase shift mask, a method for manufacturing the same, and a method for forming a micro pattern using the same.

Discussion of the Background

As a pattern of a semiconductor device is getting smaller, a photo mask has become one of important constituent elements thereof. The size of a semiconductor device is determined by resolution ability of photolithography, and resolution of a lithography process mostly depends on a light source of an exposure device. Recently, however, developing speed of the exposure device is unable to catch up with the miniaturization trend of a pattern of a semiconductor device. Further, since the development cost for the exposure device increases sharply, there have been attempts to implement a micro pattern through combination of a resolution enhancement technique with a light source of the existing exposure device.

One of the strongest resolution enhancement techniques is to use a phase shift mask (PSM). The phase shift mask has high resolution and high focus latitude compared to a general binary mask, and thus a micro pattern can be stably obtained through the phase shift mask.

A phase shift mask in the related art is formed by using a film that includes CrO or Mosi. In the case of the phase shift mask using the CrO or Mosi film, the degree of phase change and the degree of transmittance are determined by the thickness of the film, and it may be difficult to individually adjust the degree of phase change and the degree of transmittance.

The above information disclosed in this Background section is only for enhancement of understanding of the background of the inventive concept, and, therefore, it may contain information that does not form the prior art that is already known in this country to a person of ordinary skill in the art.

SUMMARY

Accordingly, one subject to be solved by the present invention is to provide a phase shift mask which can improve resolution in a photolithography process and a method for forming a micro pattern using the same.

Additional aspects will be set forth in the detailed description which follows, and, in part, will be apparent from the disclosure, or may be learned by practice of the inventive concept.

Another subject to be solved by the present invention is to provide a method for manufacturing a phase shift mask, which can easily adjust transmittance of the phase shift mask and the degree of phase change.

Still another subject to be solved by the present invention is to provide a method for manufacturing a phase shift mask, which can simplify a process of manufacturing a phase shift mask.

Additional advantages, subjects, and features of the invention will be set forth in part in the description which follows and in part will become apparent to those having ordinary skill in the art upon examination of the following or may be learned from practice of the invention.

In one aspect of the present invention, there is provided a phase shift mask comprising: a transparent substrate; a phase shift pattern arranged on the transparent substrate to change a phase of light that penetrates the transparent substrate; and a metal coating layer arranged on at least a part of a surface of the phase shift pattern.

The phase shift pattern comprises polymer.

The metal coating layer is arranged entirely on the surface of the phase shift pattern.

The metal coating layer has a uniform thickness.

The surface of the phase shift pattern comprises an upper surface and a side surface, and the metal coating layer is arranged on at least a part of the side surface of the phase shift pattern while covering the upper surface thereof. The center portion of the phase shift pattern is shaped to rise convexly.

The surface of the phase shift pattern comprises an upper surface and a side surface, and a thickness of the metal coating layer that is arranged on the upper surface of the phase shift pattern is different from a thickness of the metal coating layer that is arranged on the side surface of the phase shift pattern.

The metal coating layer is implemented in an asymmetrical shape.

According to another aspect of the present invention, there is provided a method for manufacturing a phase shift mask comprising: forming a phase shift pattern on a transparent substrate through a photolithography process; and forming a metal coating layer on at least a part of a surface of the phase shift pattern.

The metal coating layer is formed entirely on the surface of the phase shift pattern.

The metal coating layer is formed through an electroless plating process.

The metal coating layer is formed with a uniform thickness.

The surface of the phase shift pattern comprises an upper surface and a side surface, and the metal coating layer is formed on at least a part of the side surface of the phase shife pattern while covering the upper surface thereof. The eletroless plating process is one of displacement plating, contact plating, non-catalytic chemical plating and catalytic chemical plating. The surface of the phase shift pattern comprises an upper surface and a side surface, and a thickness of the metal coating layer that is formed on the upper surface of the phase shift pattern is different from a thickness of the metal coating layer that is formed on the side surface of the phase shift pattern.

According to another aspect of the present invention, there is provided a method for forming a micro pattern comprising: a forming a resist layer on a substrate through spreading of photoresist; positioning a phase shift mask on the resist layer; and forming a resist pattern through selectively exposing and developing the resist layer through the phase shift mask, wherein the phase shift mask includes a transparent substrate, a phase shift pattern arranged on the transparent substrate to change a phase of light that penetrates the transparent substrate, and a metal coating layer arranged on at least a part of a surface of the phase shift pattern.

The method may further comprise forming a layer to be etched on the substrate prior to the forming the resist layer, wherein the resist layer is formed on the layer to be etched.

The method may further comprise forming a micro pattern through partial etching of the layer to be etched using the resist pattern.

The method may further comprise removing the resist pattern.

In that method, the phase shift pattern comprises polymer.

According to embodiments of the present invention, at least the following effects can be achieved.

According to the phase shift mask and the method for forming a micro pattern using the same according to an embodiment of the present invention, the resolution can be improved in the photolithography process.

Further, according to the method for manufacturing a phase shift mask according to an embodiment of the present invention, the permeability of the phase shift mask and the degree of the phase change can be easily adjusted.

Further, according to the method for manufacturing a phase shift mask according to an embodiment of the present invention, the process of manufacturing a phase shift mask can be simplified.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 3 is a cross-sectional view corresponding to a portion A of a phase shift mask according to another embodiment of the present invention taken along the line II-II' of FIG. 1.

FIGS. 4 and 5 are cross-sectional views corresponding to a portion A of a phase shift mask according to still another embodiment of the present invention taken along the line II-II' of FIG. 1;

DETAILED DESCRIPTION OF THE EMBODIMENTS

Figure 1:
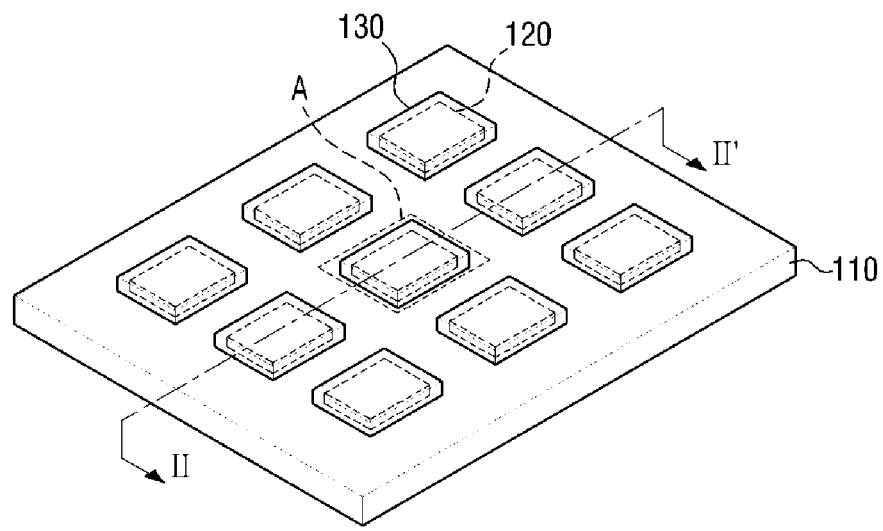
FIG. 1 is a perspective view of a phase shift mask according to an embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
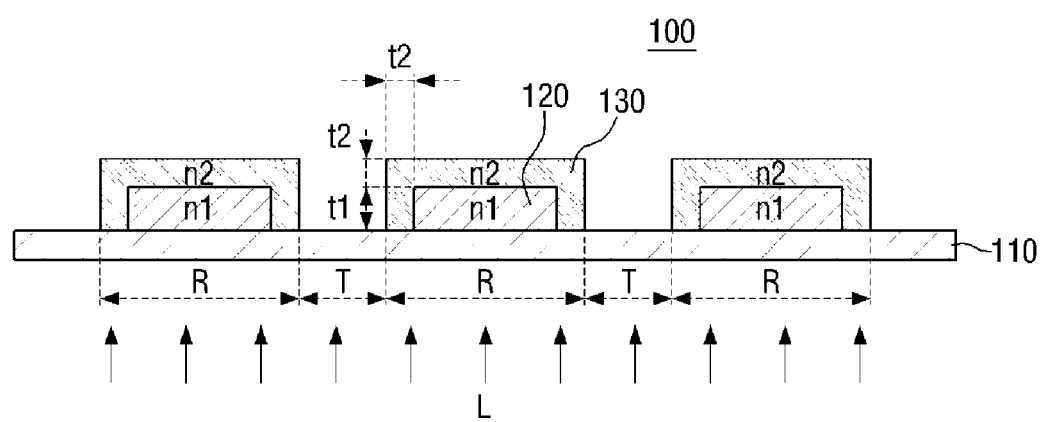
FIG. 2 is a cross-sectional view taken along a line II-II' of FIG. 1.

FIG. 1 is a perspective view of a phase shift mask according to an embodiment of the present invention, and FIG. 2 is a cross-sectional view taken along the line II-II' of FIG. 1.

Referring to FIGS. 1 and 2, a phase shift mask 100 according to an embodiment of the present invention includes a transparent substrate 110, a phase shift pattern 120, and a metal coating layer 130.

The transparent substrate 110 may be a substrate that can be penetrated by light L (FIG. 2), and as illustrated in FIG. 1, may be in a cuboidal shape. However, the shape of the transparent substrate 110 is not limited thereto.

The transparent substrate 110 may include quartz glass. In the case where the transparent substrate 110 is implemented by quartz glass, it may be advantageous in transmitting UV rays in comparison to glass that does not include quartz.

The phase shift pattern 120 is arranged on one surface of the transparent substrate 110 to change the phase of light that penetrates the transparent substrate 110. As illustrated in FIG. 1, the phase shift pattern 120 may be a cuboidal shape. However, this is merely exemplary, and the shape of the phase shift pattern 120 is not limited thereto. Further, as illustrated in FIG. 1, the phase shift pattern 120 may be regularly arranged at predetermined intervals on the transparent substrate 110, but is not limited thereto. The phase shift pattern 120 may be irregularly arranged on the transparent substrate 110.

The phase shift pattern 120 may include polymer that is a non-metal. In the case where the phase shift pattern 120 is implemented with polymer included, it may be transparent. In the case where the phase shift pattern 120 is implemented with polymer included, its taper angle may be closer to a vertical angle in comparison to a metal pattern. As the taper angle of the phase shift pattern 120 becomes closer to the vertical angle, a NILS (Normalized Intensity Log Slope) value that is obtained by digitizing the quality of light that penetrates the mask may be increased.

The metal coating layer 130 may change the phase of the light that penetrates the transparent substrate 110, and the transmittance of the light that penetrates the transparent substrate 110 may be determined by the metal coating layer 130.

The metal coating layer 130 may be arranged on at least a part of the surface of the phase shift pattern 120. In some embodiments, the metal coating layer 130 may be arranged on the surface of the phase shift pattern 120 with an uniform thickness t2 as illustrated in FIG. 2. However, this is merely exemplary, and the thickness of the metal coating layer 130 may not be uniform.

In the case where the phase shift pattern 120 is in a cuboidal shape as illustrated in FIGS. 1 and 2, the metal coating layer 130 may be arranged entirely on an upper surface and a side surface of the phase shift pattern 120. However, the shapes of the phase shift pattern 120 and the metal coating layer 130 are not limited thereto. Hereinafter, the shapes of the phase shift pattern 120 and the metal coating layer 130 will be described in detail.

The phase shift mask 100 may change the phase of the light L incident from the other surface side of the transparent substrate 110, which penetrates a region R where the phase shift pattern 120 and the metal coating layer 130 are arranged. Further, the phase shift mask 100 may not change or may slightly change the phase of the light L incident from the other surface side of the transparent substrate 110, which penetrates a region T where the phase shift pattern 120 and the metal coating layer 130 are not arranged.

The degree of phase change of the light L that penetrates the region R may be determined by the refractive index n1 and the thickness t1 of the phase shift pattern 120 and the refractive index n2 and the thickness t2 of the metal coating layer 130. The refractive index n1 of the phase shift pattern 120 and the refractive index n2 of the metal coating layer 130 may be determined by constituent materials included in the phase shift pattern 120 and the metal coating layer 130.

For example, as the refractive index n1 and the thickness t1 of the phase shift pattern 120 and the refractive index n2 and the thickness t2 of the metal coating layer 130 have appropriate values, the phase of the light that penetrates the region R may be changed by 180°. That is, the phase of the light that penetrates the region R may be inverted.

In some embodiments, the phase shift pattern 120 may be implemented to include transparent polymer. In the case where the phase shift pattern 120 includes transparent polymer, the transmittance of the light that penetrates the region R where the phase shift pattern 120 and the metal coating layer 130 are arranged may be determined by the attenuation constant and the thickness t2 of the metal coating layer 130. That is, the transparent polymer may exert a slight influence on the transmittance of the light. The attenuation constant of the metal coating layer 130 may be determined by constituent materials included in the metal coating layer 130 such as gold (Au), silver (Ag), aluminum (Al), nickel (Ni), chrome (Cr), and copper (Cu). However the material is not limited thererto.

FIG. 3 is a cross-sectional view corresponding to a portion A of a phase shift mask according to another embodiment of the present invention taken along the line II-II' of FIG. 1.

Referring to FIG. 3, a phase shift mask 100a according to another embodiment of the present invention may include a phase shift pattern 120a and a metal coating layer 130a of which the shapes are different from the shapes of the phase shift pattern 120 and the metal coating layer 130 included in the phase shift mask 100 (in FIG. 2) according to the above-described embodiment of FIG. 2. Since other remaining configurations are the same as or are similar to those according to the above-described embodiment, explanation will be made around the different points between this embodiment and the above-described embodiment except for the duplicate portions.

According to the phase shift mask 100a according to another embodiment of the present invention as illustrated in FIG. 3, the center portion of the phase shift pattern 120a may be shaped to rise convexly. However, this is merely exemplary, and the shape of the phase shift pattern 120a is not limited thereto.

The metal coating layer 130a may be arranged on at least a part of the surface of the phase shift pattern 120a. In some embodiments, the metal coating layer 130a may be arranged entirely on the surface of the phase shift pattern 120a with a uniform thickness t3 as illustrated in FIG. 3.

The phase shift pattern 120a may include an upper surface and a side surface, and in some embodiments, the metal coating layer 130a may be arranged entirely on the upper surface and the side surface of the phase shift pattern 120a as illustrated in FIG. 3.

In this embodiment, the upper surface of the phase shift pattern 120a may be defined as a surface that is formed on a region U of the surface of the phase shift pattern 120a with a predetermined height H or more on the basis of the transparent substrate 110. Further, the side surface of the phase shift pattern 120a may be defined as a surface that is formed on a region S of the surface of the phase shift pattern 120a within the predetermined height H on the basis of the transparent substrate 110. However, the reference to define the upper surface and the side surface of the phase shift pattern 120a is not limited thereto. For example, the upper surface and the side surface of the phase shift pattern 120a may be defined on the basis on a predetermined curvature value.

FIG. 4 is a cross-sectional view corresponding to a portion A of a phase shift mask according to still another embodiment of the present invention taken along the line II-II' of FIG. 1.

Referring to FIG. 4, a phase shift mask 100b according to still another embodiment of the present invention may include a metal coating layer 130b of which the shape is different from the shape of the metal coating layer 130a included in the phase shift mask 100a (in FIG. 3) according to the above-described embodiment of FIG. 3. Since other remaining configurations are the same as or are similar to those according to the above-described embodiment, explanation will be made around the different point between this embodiment and the above-described embodiment except for the duplicate portions.

According to the phase shift mask 100b according to still another embodiment of the present invention as illustrated in FIG. 4, the metal coating layer 130b may be arranged on a part of the surface of a phase shift pattern 120b. More specifically, the metal coating layer 130b may be arranged on a part of a side surface of the phase shift pattern 120b while covering an upper surface thereof.

In this embodiment, it is exemplified that the cross-sectional shape of the metal coating layer 130b that is arranged on the side surface of the phase shift pattern 120b is in a bilaterally symmetrical shape, but is not limited thereto. The cross-sectional shape of the metal coating layer 130b may be implemented in an asymmetrical shape. For example, the metal coating layer 130b may be arranged entirely on one side surface of the phase shift pattern 120b and on a part of the other side surface. Further, in this embodiment, it is exemplified that the metal coating layer 130b is arranged entirely on the upper surface of the phase shift pattern 120b, but is not limited thereto. The metal coating layer 130b may be arranged on a part of the upper surface of the phase shift pattern 120b.

Figure 5:
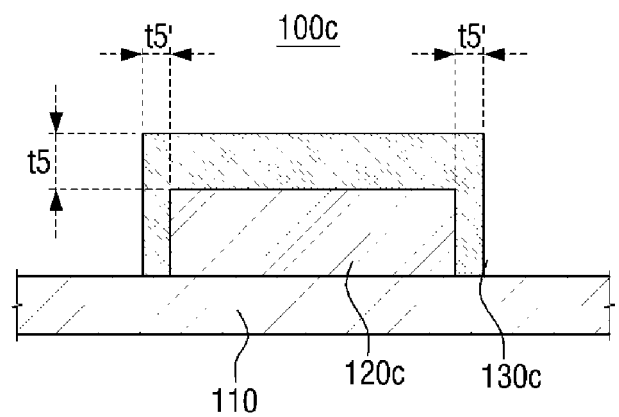

FIG. 5 is a cross-sectional view corresponding to a portion A of a phase shift mask according to still another embodiment of the present invention taken along the line II-II' of FIG. 1.

Referring to FIG. 5, a phase shift mask 100c according to still another embodiment of the present invention may include a metal coating layer 130c of which the shape is different from the shape of the metal coating layer 130 included in the phase shift mask 100 (in FIG. 2) according to the above-described embodiment of FIG. 2. Since other remaining configurations are the same as or are similar to those according to the above-described embodiment, explanation will be made around the different point between this embodiment and the above-described embodiment except for the duplicate portions.

According to the phase shift mask 100c according to still another embodiment of the present invention as illustrated in FIG. 5, the metal coating layer 130c may be spread on a phase shift pattern 120c with a non-uniform thickness. More specifically, the thickness t5 of the metal coating layer 130c that is arranged on an upper surface of the phase shift pattern 120c may be thicker than the thickness t5' of the metal coating layer 130c that is arranged on a side surface of the phase shift pattern 120c.

In this embodiment, it is exemplified that the upper surface thickness t5 of the metal coating layer 130c is thicker than the side surface thickness t5' of the metal coating layer 130c, but is not limited thereto. The upper surface thickness t5 of the metal coating layer 130c may be thinner than the side surface thickness t5' of the metal coating layer 130c.

Further, in this embodiment, it is exemplified that the side surface thickness t5' of the metal coating layer 130c is uniform, but is not limited thereto. The side surface thickness t5' of the metal coating layer 130c may not be uniform. For example, the thickness of the metal coating layer arranged on one side surface may be thicker than the thickness of the metal coating layer arranged on the other side surface.

Further, in this embodiment, it is exemplified that the thicknesses of the metal coating layer 130c arranged on the upper surface and the side surface of the phase shift pattern 120c are uniformly t5 and t5', but are not limited thereto. The thicknesses of the metal coating layer 130c arranged on the upper surface and the side surface of the phase shift pattern 120c may not be uniform. For example, the thickness of the metal coating layer 130c arranged on the upper surface of the phase shift pattern 120c may not be uniform.

Figure 6:
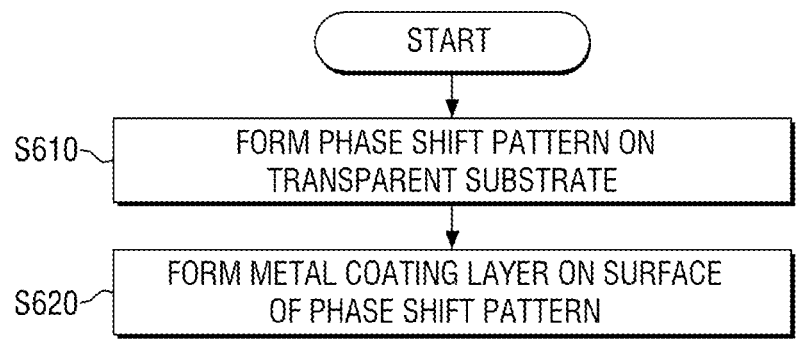
FIG. 6 is a flowchart illustrating a method for manufacturing a phase shift mask according to an embodiment of the present invention.
Figure 7:
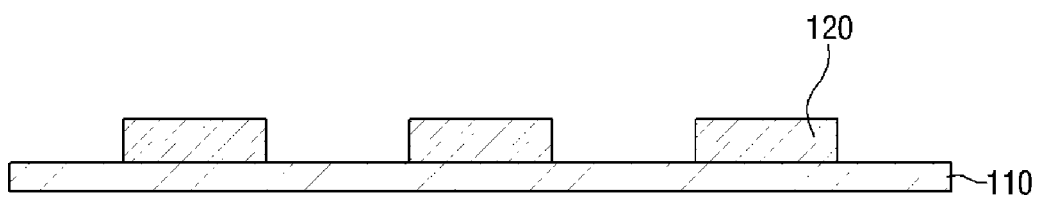
FIGS. 7 and 8 are cross-sectional views illustrating processes of manufacturing a phase shift mask according to an embodiment of the present invention.
Figure 8:
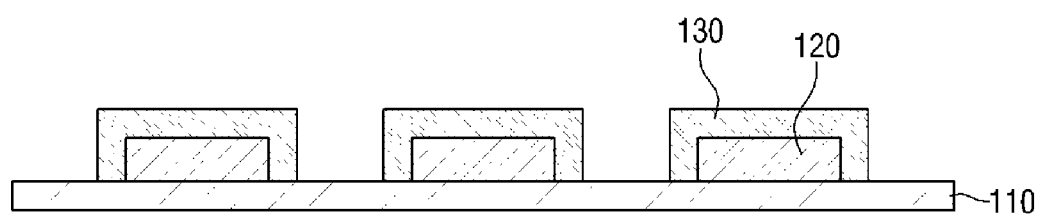

FIG. 6 is a flowchart illustrating a method for manufacturing a phase shift mask according to an embodiment of the present invention, and FIGS. 7 and 8 are cross-sectional views illustrating processes of manufacturing a phase shift mask according to an embodiment of the present invention.

Referring to FIGS. 6 and 7, according to a method for manufacturing a phase shift mask according to an embodiment of the present invention, a phase shift pattern 120 is first formed on a transparent substrate 110 through a photolithography process (S610). Through this step, the phase shift pattern 120 including polymer that is a nonmetal may be formed.

Specifically, S610 may include spreading photoresist on the transparent substrate 110 through spin coating, spraying, or tempering, positioning a photo mask on which a pattern to be formed is marked on the spread photoresist, selectively exposing the photoresist through the photo mask, and removing an exposed portion (or unexposed portion).

According to the method for manufacturing a phase shift mask according to an embodiment of the present invention, the phase shift pattern 120 that includes polymer that is a nonmetal may be formed only through a photolithography process without performing separate wet etching and strip processes. Accordingly, the taper angle of the phase shift pattern 120 may be closer to a vertical angle in comparison to the taper angle of the metal phase shift pattern that is formed by the wet etching process and the like. As the taper angle of the phase shift pattern 120 becomes closer to the vertical angle, a NILS (Normalized Intensity Log Slope) value that is obtained by digitizing the quality of light that penetrates the mask may be increased.

Next, referring to FIGS. 6 and 8, a metal coating layer 130 is formed on at least a part of the surface of the phase shift pattern 120 (S620). For example, the metal coating layer 130 may be formed entirely on the surface of the phase shift pattern 120. In some embodiments, S620 may be performed through an electroless plating process and the like. That is, the metal coating layer 130 may be formed on the phase shift pattern 120 through the electroless plating process. The electroless plating may be one that plates subjects without applying electrical energy from outside. For example, displacement plating, contact plating, non-catalytic chemical plating, or catalytic chemical plating may correspond to the electroless plating. A coating rate of about 10 Å/min can be precisely implemented through the electroless plating process. Accordingly, precise thickness implementation becomes possible through a ratio adjustment of metal ions and reducing agents.

According to the method for manufacturing a phase shift mask according to an embodiment of the present invention, the metal coating layer 130 can be formed with a uniform thickness through a uniform electroless plating process. Further, the metal coating layer 130 can be formed on the phase shift pattern 120 that includes non-metal polymer through the electroless plating process. Further, the metal coating layer 130 that includes various kinds of metals, such as gold (Au), silver (Ag), aluminum (Al), nickel (Ni), chrome (Cr), and copper (Cu), can be formed on the phase shift pattern 120 through the electroless plating.

According to the method for manufacturing a phase shift mask according to some embodiments of the present invention, the phase shift pattern 120 may be formed so that the surface of the phase shift pattern 120 includes an upper surface and a side surface as illustrated in FIG. 7.

In this case, the metal coating layer 130 may be formed on at least a part of the upper surface and the side surface of the phase shift pattern 120. For example, the metal coating layer 130 may be formed entirely on the upper surface and the side surface of the phase shift pattern 120.

In this case, in some embodiments, the metal coating layer 130 can be formed on the upper surface and the side surface of the phase shift pattern 120 with a uniform thickness, but is not limited thereto. The thickness of the metal coating layer 130 that is formed on the upper surface of the phase shift pattern 120 may be different from the thickness of the metal coating layer 130 that is formed on the side surface of the phase shift pattern 120.

According to the method for manufacturing a phase shift mask according to an embodiment of the present invention, the kinds and thicknesses of the phase shift pattern 120 and the metal coating layer 130 may be appropriately selected according to the degree of phase change and the permeability of the phase shift mask to be manufactured.

Referring again to FIG. 2, this will be described in detail. As described above, the degree of phase change of the light that penetrates the region R where the phase shift pattern 120 and the metal coating layer 130 are arranged may be determined by the refractive index n1 and the thickness t1 of the phase shift pattern 120 and the refractive index n2 of the thickness t2 of the metal coating layer 130. The permeability may be mainly determined by the attenuation constant and the thickness t2 of the metal coating layer 130.

Accordingly, the thickness t2 of the metal coating layer 130 may be first determined in consideration of the transmittance of the phase shift mask 100 to be manufactured, and then the thickness t1 of the phase shift pattern 120 may be determined in consideration of the degree of phase change of the phase shift mask 100 and the thickness t2 of the metal coating layer 130. That is, the transmittance of the phase shift mask 100 may be independently controlled through adjustment of the thickness t2 of the metal coating layer 130, and the degree of phase change of the phase shift mask 100 may be independently controlled through adjustment of the thickness t1 of the phase shift pattern 120.

Further, the present invention, as described above, can manufacture the phase shift mask by forming the phase shift pattern 120 only through the photolithography process without separate etching and strip processes and forming the metal coating layer 130 on the phase shift pattern 120 through the electroless plating process. This simplifies the process of manufacturing a phase shift mask.

Hereinafter, a method for forming a micro pattern using the phase shift mask 100 will be described.

The method for forming a micro pattern according to an embodiment of the present invention may form a micro pattern, such as a wire, an electrode, and a contact hole, on the substrate. That is, the method for forming a micro pattern according to an embodiment of the present invention, may process on the semiconductor substrate an integrated circuit, a thin film circuit, or a wire pattern that includes the micro pattern. Further, the method for forming a micro pattern according to an embodiment of the present invention can form a pattern having a micro size of about 100 nm or less.

FIGS. 9 through 14 are cross-sectional views explaining a method for forming a micro pattern according to an embodiment of the present invention.

Figure 9:
FIGS. 9 to 14 are cross-sectional views explaining a method for forming a micro pattern according to an embodiment of the present invention.

Referring to FIG. 9, according to an exemplary embodiment of the present invention, a layer 920 to be etched is first formed on a substrate 910 (S910). The layer 920 to be etched may include a semiconductor material layer, an insulating layer, or a conductive layer.

Figure 10:
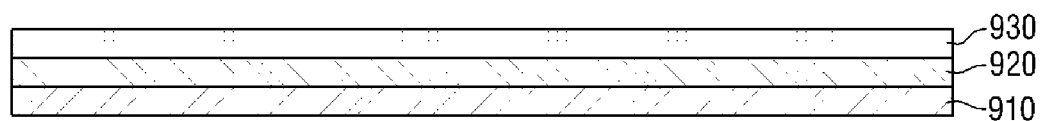

Next, referring to FIG. 10, a resist layer 930 is formed through spreading of photoresist on the layer 920 to be etched. The resist layer 930 may be formed through spin coating, spraying, or tempering. The photoresist may be positive photoresist or negative photoresist.

In some embodiments, as illustrated in FIGS. 9 and 10, the layer 920 to be etched and the resist layer 930 may be sequentially stacked. However, this is merely exemplary, and the resist layer 930 may be directly stacked on the substrate 910.

Figure 11:
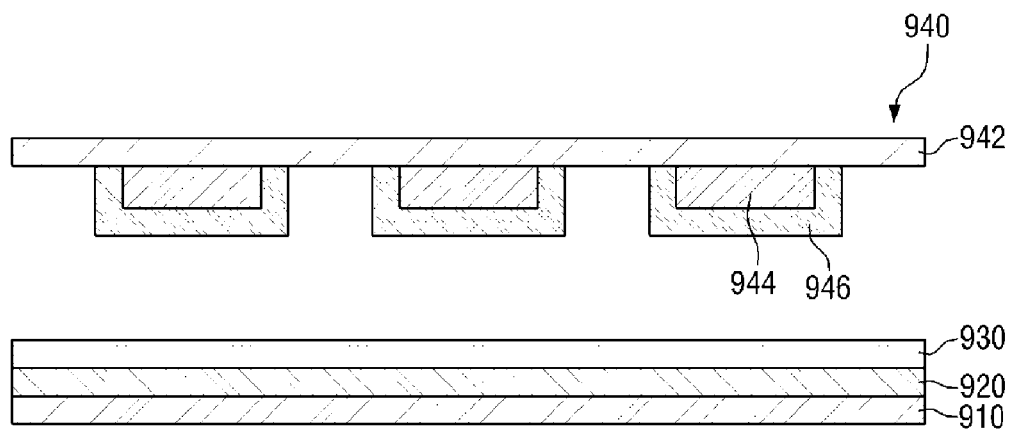

Next, referring to FIG. 11, a phase shift mask 940 is positioned on the resist layer 930.

The phase shift mask 940 may be substantially the same as the phase shift mask 100, 100*a*, 100*b*, or 100*c* as described above according to the embodiments of FIGS. 1 through 5. Further, the phase shift mask 940 may be a phase shift mask that is manufactured according to the method for manufacturing a phase shift mask as described above according to the embodiments of FIGS. 6 through 8.

That is, the phase shift mask 940 may include a transparent substrate 942, a phase shift pattern 944 arranged on the transparent substrate 942 to change the phase of light that penetrates the transparent substrate 942, and a metal coating layer 946 arranged on at least a part of the surface of the phase shift pattern 944.

Figure 12:
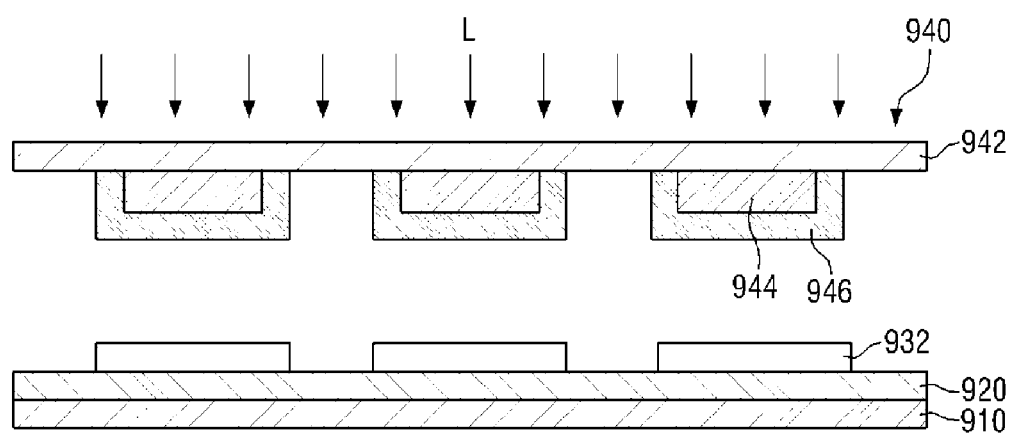

Next, referring to FIG. 12, the resist layer 930 is selectively exposed through the phase shift mask 940 and then is developed to form a resist pattern 932. In this embodiment, it is exemplified that the positive resist is used as the photoresist. However, in the case where the resist layer is formed using the negative resist as the photoresist, the resist pattern may be formed by the exposed portion.

Figure 13:
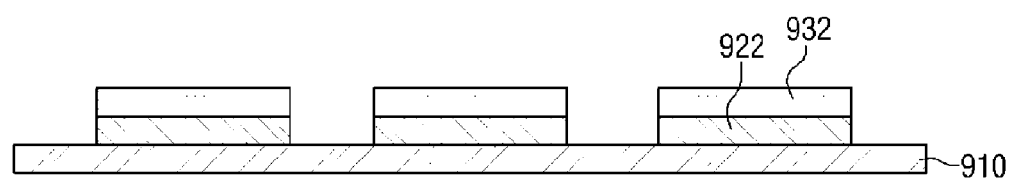

Next, referring to FIG. 13, a micro pattern 922 may be formed through partial etching of the layer 920 to be etched using the resist pattern 932. Through this, the micro pattern 922 may be formed on the layer 920 to be etched. For example, the micro pattern, such as a wire, an electrode pattern, an insulating pattern, or a contact hole, may be formed on the substrate 910. A wet etching process, a dry etching process, or a reactive ion etching process may be adopted to partially etch the layer 920 to be etched, but the present invention is not limited thereto.

Figure 14:

Next, referring to FIG. 14, the resist pattern 932 may be removed. In order to remove the resist pattern 932, ashing, cleaning through sulfuric acid (H2SO4) and hydrogen peroxide water (H2O4), or organic stripper may be used. However, this is merely exemplary, and the present invention is not limited thereto.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A phase shift mask, comprising:
   a transparent substrate;
   a phase shift pattern arranged on the transparent substrate; and
   a metal coating layer arranged on at least a part of a surface of the phase shift pattern,
   wherein the phase shift pattern and the metal coating layer change a phase of light that penetrates a region where the phase shift pattern and the metal coating layer are arranged,
   wherein the phase shift pattern changes a phase of light that penetrates a region where the phase shift pattern is arranged to a first phase,
   wherein the metal coating layer changes a phase of light that penetrates a region where the metal coating layer is arranged to a second phase, and
   wherein the phase shift pattern comprises polymer.

2. The phase shift mask of claim 1, wherein the metal coating layer is arranged entirely on the surface of the phase shift pattern.

3. The phase shift mask of claim 1, wherein the metal coating layer has a uniform thickness.

4. The phase shift mask of claim 1, wherein the surface of the phase shift pattern comprises an upper surface and a side surface, and the metal coating layer is arranged on at least a part of the side surface of the phase shift pattern while covering the upper surface thereof.

5. The phase shift mask of claim 1, wherein the center portion of the phase shift pattern is shaped to rise convexly.

6. The phase shift mask of claim 1, wherein the surface of the phase shift pattern comprises an upper surface and a side surface, and a thickness of the metal coating layer that is arranged on the upper surface of the phase shift pattern is different from a thickness of the metal coating layer that is arranged on the side surface of the phase shift pattern.

7. The phase shift mask of claim 1, wherein the metal coating layer is implemented in an asymmetrical shape.

8. A method for manufacturing a phase shift mask, comprising:
   forming a phase shift pattern on a transparent substrate through a photolithography process; and
   forming a metal coating layer on at least a part of a surface of the phase shift pattern,
   wherein the phase shift pattern and the metal coating layer change a phase of light that penetrates a region where the phase shift pattern and the metal coating layer are arranged,
   wherein the phase shift pattern changes a phase of light that penetrates a region where the phase shift pattern is arranged to a first phase,
   wherein the metal coating layer changes a phase of light that penetrates a region where the metal coating layer is arranged to a second phase,
   wherein the phase shift pattern comprises an upper surface and a side surface,
   wherein the metal coating layer is formed to cover the upper surface of the phase shift pattern and to be disposed on the side surface of the phase shift pattern, and
   wherein a first portion of the metal coating layer that is formed on the upper surface of the phase shift pattern has a thickness different from a second portion of the metal coating layer that is formed on the side surface of the phase shift pattern.

9. The method of claim 8, wherein the metal coating layer is formed through an electroless plating process.

10. The method of claim 9, wherein the electroless plating process is one of displacement plating, contact plating, non-catalytic chemical plating and catalytic chemical plating.

11. A method for forming a micro pattern, comprising:
    forming a resist layer on a substrate through spreading of photoresist;
    positioning a phase shift mask on the resist layer; and
    forming a resist pattern through selectively exposing and developing the resist layer through the phase shift mask,
    wherein the phase shift mask includes a transparent substrate, a phase shift pattern arranged on the transparent substrate, and a metal coating layer arranged on at least a part of a surface of the phase shift pattern,
    wherein the phase shift pattern and the metal coating layer change a phase of light that penetrates a region where the phase shift pattern and the metal coating layer are arranged,
    wherein the phase shift pattern changes a phase of light that penetrates a region where the phase shift pattern is arranged to a first phase,
    wherein the metal coating layer changes a phase of light that penetrates a region where the metal coating layer is arranged to a second phase,
    wherein the phase shift pattern comprises an upper surface and a side surface,
    wherein the metal coating layer is formed to cover the upper surface of the phase shift pattern and to be disposed on the side surface of the phase shift pattern, and
    wherein a first portion of the metal coating layer that is formed on the upper surface of the phase shift pattern has a thickness different from a second portion of the metal coating layer that is formed on the side surface of the phase shift pattern.

12. The method of claim 11, further comprising:
forming a layer to be etched on the substrate prior to forming the resist layer,
wherein the resist layer is formed on the layer to be etched.

13. The method of claim 12, further comprising:
forming a micro pattern through partial etching of the layer to be etched using the resist pattern.

14. The method of claim 13, further comprising:
removing the resist pattern.

\* \* \* \* \*